(12) United States Patent
Strandberg

(10) Patent No.: US 6,586,682 B2
(45) Date of Patent: Jul. 1, 2003

(54) PRINTED WIRING BOARD WITH CONTROLLED LINE IMPEDANCE

(75) Inventor: Jan I. Strandberg, Palo Alto, CA (US)

(73) Assignee: Kulicke & Soffa Holdings, Inc., Willow Grove, PA (US)

( * ) Notice: Subject to any disclaimer, the term of this patent is extended or adjusted under 35 U.S.C. 154(b) by 0 days.

(21) Appl. No.: 09/511,194

(22) Filed: Feb. 23, 2000

(65) Prior Publication Data
US 2002/0139566 A1 Oct. 3, 2002

(51) Int. Cl.[7] .................................................. H05K 1/03
(52) U.S. Cl. ....................................... 174/255; 361/795
(58) Field of Search ............................... 174/250, 260, 174/262, 256, 258, 255; 361/792, 795, 794, 780; 257/700, 701, 702, 703, 648, 774

(56) References Cited

U.S. PATENT DOCUMENTS

| | | | |
|---|---|---|---|
| 4,353,040 A | 10/1982 | Krumm et al. | 333/1 |
| 4,544,989 A | 10/1985 | Nakabu et al. | 361/401 |
| 4,713,494 A * | 12/1987 | Oikawa et al. | 174/68.5 |
| 4,736,521 A * | 4/1988 | Dohya | 29/830 |
| 4,783,695 A | 11/1988 | Eichelberger et al. | 357/65 |
| 4,798,918 A * | 1/1989 | Kabadi et al. | 174/36 |
| 4,816,323 A * | 3/1989 | Inoue | 156/89.16 |
| 4,827,083 A * | 5/1989 | Inasaka et al. | 174/264 |
| 4,963,697 A | 10/1990 | Peterson et al. | 174/252 |
| 5,106,461 A | 4/1992 | Volfson et al. | 205/125 |
| 5,172,472 A | 12/1992 | Lindner et al. | 29/845 |
| 5,262,590 A | 11/1993 | Lia | 174/36 |
| 5,654,220 A | 8/1997 | Leedy | 438/25 |
| 5,766,825 A | 6/1998 | Shirai et al. | 430/327 |
| 6,040,524 A * | 3/2000 | Kobayashi et al. | 174/36 |
| 6,183,588 B1 * | 2/2001 | Kelly et al. | 156/247 |
| 6,384,344 B1 * | 5/2002 | Asai et al. | 174/260 |

FOREIGN PATENT DOCUMENTS

| | | |
|---|---|---|
| WO | 2000-22328 | 1/2000 |
| WO | WO 00/07233 | 2/2000 |
| WO | WO 00/07421 | 2/2000 |

OTHER PUBLICATIONS

U.S. patent application Ser. No. 09/127,579, Westbrook et al., filed Jul. 31, 1998.
U.S. patent application Ser. No. 09/127,580, Chazan et al., filed Jul. 31, 1998.

* cited by examiner

Primary Examiner—David L. Talbott
Assistant Examiner—Jeremy Norris
(74) Attorney, Agent, or Firm—Townsend and Townsend and Crew LLP

(57) ABSTRACT

The present invention provides a solution to the problem of controlling the inter-layer impedance of a deposited thin film layer stack accommodating high-density interconnects. The invention enables high-density signal lines to be routed over a reference plane to achieve a desired characteristic impedance. In one embodiment, a first thin-film metal layer is formed on a planarized layer fabricated from multiple thin film dielectric layers. The reduced pad footprint in the first thin-film metal layer allows a major portion of the first thin-film metal layer to serve as a reference, or ground, plane to signal lines formed in a second thin-film metal layer that is separated from the first thin-film metal layer by a thin dielectric layer.

21 Claims, 5 Drawing Sheets

PRINTED WIRING BOARD WITH CONTROLLED LINE IMPEDANCE

BACKGROUND OF THE INVENTION

The present invention relates to the use of thin film deposition technology to create high density interconnects on a printed wiring board substrate. More specifically, the present invention pertains to an improved method for controlling the impedance of signal lines formed on a high-density interconnect substrate. The present invention increases the surface area available for routing wiring having improved impedance characteristics. The method of the present invention can be used with or without an initial build-up layer on a printed wiring substrate provided by a substrate vendor, and is useful for high density integrated circuit packaging of single chip or multi-chip hybrid circuits including components such as resistors and capacitors. The method of the present invention is also useful for creating interconnections on high-density "daughter" boards that carry packaged devices.

The semiconductor industry continues to produce integrated circuits of increasing complexity and increasing density. The increased complexity of some of these integrated circuits has in turn resulted in an increased number of input/output pads on the circuit chips. At the same time, the increased density of the chips has driven the input/output pad pitch, i.e. the spacing between pads, downward. The combination of these two trends has been both a significant increase in the connector pin wiring density and closer spacing of the pins. Concurrent with this increased pin density and lower pitch has been an increase in the frequency of signals that are sent through the wiring substrate. A simple, uncharacterized wire is no longer optimum for these high frequency signals, and a signal line having a selected characteristic is desired. In other words, it is desirable that the signal lines are transmission lines with a known and controlled characteristic impedance.

A number of different technologies have been developed to interconnect multiple integrated circuits and related components. One such technology, based on traditional printed wiring board ("PWB") technology is often referred to as MCM-L or laminate MCM technology. This technology found wide use during the period in which integrated circuits were packaged in dual-in-line packages ("DIPs"). MCM-L technology typically uses sub-laminate boards of copper foil and dielectric material layers to create a laminated interconnect structures. Conductive patterns on the sub-laminate in MCM-L process are typically formed using a dry film of photo resist over the copper layer, patterning and developing the photo resist to from an appropriate mask, and selectively etching away the unwanted copper, thereby leaving the desired patterned conductive layer.

Substrates used in MCM-L technology can be manufactured in large-area panels that are efficient and relatively low-cost. Interconnect solutions using this technology generally have relatively good performance characteristics when used with the generally wide-pitch, low pin density DIP components. The printed wiring board industry, however, has not kept pace with the advances in semiconductor manufacturing in terms of pad density.

In some applications, two or more sub-laminates are stacked together to form a final, stacked structure, or multilayer laminated printed wiring substrate. Interconnection between stacked layers can be provided by a plated through hole ("PTH"). One way to make a PTH is to drill a hole through the board, and then plate the interior surface of the hole. The drilling process is relatively slow and expensive and can require a large amount of board space, thus reducing the area available for signal routing. As the number of interconnect pads increases, an increased number of signal layers is often used to form the interconnect structure. Because of these limitations, the conventional printed wiring board technology needs to use a large number of metal layers (e.g. greater than eight layers for some of the applications) in high density integrated circuit packaging and daughter board fabrication. Utilizing a large number of metal layers in this context generally increases cost and decreases electrical performance. Also, the pad size limits the wiring density on any given layer with this technology. Thus, MCM-L technology, while useful for some applications, is not capable of providing the connection density required in other applications.

To improve the interconnect density of MCM-L technology, an advanced printed wiring board technology approach called build-up multi-layer has been developed. In this technology a traditional laminated printed wiring board core is the starting point. Standard drilling and plating techniques are used to form plated through holes in the core. From the basic core this build-up approach has many variations. Typically, a dielectric layer approximately 50 micrometers thick is formed on the top, bottom, or both major surfaces of the laminated wiring board substrate, although in some instances the layer may be only about 30 microns thick. Vias are formed in the build-up layer by laser ablation, photo mask/plasma etch, photo exposure and development, or other methods. An electroless seeding step is then done prior to a panel plating step to metallize the surface(s) of the dielectric layer(s). The metal layer is typically 10–15 microns thick, but could be as thin as 4–5 microns. Typically, subsequent masking and wet etching steps then define a desired conductive pattern in the metal layer on the build-up dielectric layer.

Another approach used to package high density input/output uses thick film (i.e. screen printing) over co-fired ceramic substrates. This technology is sometimes referred to as "MCM-C", for co-fired ceramic MCM and thick film MCM technology. Basically, MCM-C technology involves rolling a ceramic mixture into sheets, drying the sheets, punching vias through the green ceramic sheets, screening the rolled sheets with a metal paste to form an electrical trace pattern on the surface of the ceramic sheet(s), stacking and laminating all the sheets together, then co-firing at a high temperature (e.g. typically at a temperature greater than 850° C.) to form a substrate assembly with the desired interconnections.

MCM-C construction has found extensive use in high density and high reliability products where the robustness of the high density interconnect package outweighs the cost considerations. The ability to create a hermetic seal in the ceramic improves the ability to withstand environments not tolerable to conventional printed wiring board technology. While this technology is capable of high-density packaging applications (e.g. greater than 1000 pads), it is also very costly. Additionally, performance characteristics, such as signal propagation time, are affected by the relatively high dielectric constant (e.g. typically between 5.0 and 9.0) of the ceramic material. MCM-C technology provides higher connection density than MCM-L technology, but is not capable of providing the connection density required for some of today's high density interconnect applications, and is difficult to use to produce large panels.

A third approach which the high density interconnect and packaging industry has moved toward to address these high density interconnect applications uses thin film MCM technology and is sometimes referred to as "MCM-D" for MCM deposition technology. In some applications, such MCM-D technology includes forming and patterning thin film conductive traces over large substrates such as the laminated printed wiring boards discussed above. Such large substrates may have a surface area of 40 centimeters by 40 centimeters or more, thereby providing efficiencies that lower the costs of production. This type of technology is also sometimes referred to as "DONL" for deposited-on-laminate.

MCM-D technology utilizes a combination of low cost printed wiring board structures, with or without the use of the build-up multi-layers (i.e. a build-up layer and a first metal layer supplied by the substrate vendor) on the laminated printed wiring board, as a starting point to meet higher density and lower cost interconnect requirements. One feature of MCM-D technology is that it can produce a high-density interconnect substrate using thin film processes on only one side of the printed wiring board. The total thickness of several of these deposited layers can be less than the thickness of a single traditional build-up layer. This can eliminate the need for balancing the build-up layers on both top and bottom to prevent the substrate from warping.

Despite the definite advantages of MCM-D technology, there are potential problems that may result in failure modes and performance limitations if the thin film formation is not properly implemented. One such limitation resulting from improperly deposited thin film build-up layers is sub-optimized inter-layer impedance. The thin-film techniques used in MCM-D technology can provide for narrow, closely spaced signal lines in the patterned conductor layer, and for a conductor layer that is separated from another conductor layer by a relatively very thin dielectric layer. These and other factors can result in a signal line of high and/or varying impedance.

Accordingly, improved methods and structures are desirable to control the impedance of signal lines in the build-up portion of MCM-D substrates.

SUMMARY OF THE INVENTION

The present invention provides a solution to the problem of controlling the impedance of signal lines in the build-up layers of printed circuit wiring substrates. The invention enables a higher portion of the total number of signal lines to achieve a desired impedance, and to reduce the uncontrolled impedance effects on the electrical performance of the high density interconnect device. Alternatively or additionally, the invention enables greater freedom in choosing a routing pattern for signal lines while retaining a desired impedance. The present invention provides a significant increase in ground reference plane area, providing increased routing of signal lines over a reference plane to achieve a controlled characteristic impedance. In one embodiment, increased pad density and a transition between a coarse pad pitch, e.g. 1 mm, and a fine pad pitch, e.g. less than or equal to about 0.1 mm, is also achieved.

According to one embodiment of the present invention, a planarized layer is formed on a laminated printed wiring substrate to improve the electrical performance of the layer and allow for finer geometry processes to define a subsequent metal layer. In one embodiment this metal layer is a thin-film layer formed by sputtering, also known as physical vapor deposition ("PVD"), or pattern plating. The fine-geometry achieved by the combination of the planarized layer and subsequent thin-film metal layer results in a smaller pad footprint, allowing more of the metal layer to serve as a "ground" (reference) plane. Alternatively, the fine-geometry methods allow definition of narrower signal lines, allowing more signal lines to be routed in a selected area, and/or allowing greater flexibility in the placement of signal lines. The use of thin layers also preserves the planarity of the surface of the thin film stack as it is built on the substrate, especially in conjunction with liquid dielectric layer precursors.

In a further embodiment, a thin dielectric layer is formed over the first thin-film metal layer and a second thin-film metal layer is formed over the thin dielectric layer. Thus, a layer stack having a planarized layer and two thin-film metal layers separated by a thin dielectric layer have been formed on a surface of a laminated printed wiring board. Portions of the first thin-film metal layer serve as a reference plane to signal lines patterned in the second thin-film metal layer. Furthermore, in one embodiment, the reference plane portions shield, at least partially, the signal lines from electrical fields in the metal layer of the laminated printed wiring substrate.

DETAILED DESCRIPTION OF PREFERRED EMBODIMENTS

The present invention provides a printed wiring substrate with improved impedance characteristics and a method for making such substrates. In one embodiment, the beneficial characteristics are obtained by applying methods from semiconductor device manufacturing technology adapted by and in combination with additional techniques for application to laminated printed wiring substrates. Methods and devices are shown with improved planarity and line resolution compared to conventional laminated substrates. These and other attributes, in combination with an improved ground plane, allow a greater portion of signal lines to pass over or under the ground plane. Such signal lines exhibit more predictable and consistent impedance, and in some instances reduced noise or cross-talk.

In order to properly provide details of the present invention, it is desirable to understand the printed wiring substrate upon which it is implemented. The printed wiring substrate serves two main functions. First, it is the platform upon which a high-density thin-film interconnection is built. Second, it can provide a transition between the very small pitch (e.g. 50–250 microns) of the solder bump, ball grid, or flip chip devices mounted on the substrate and the relatively coarse pitch (e.g. 0.8–1.27 mm) of the electrical contacts needed to mate to the outside world, such as through an edge connector or cable connector.

Figure 1A:
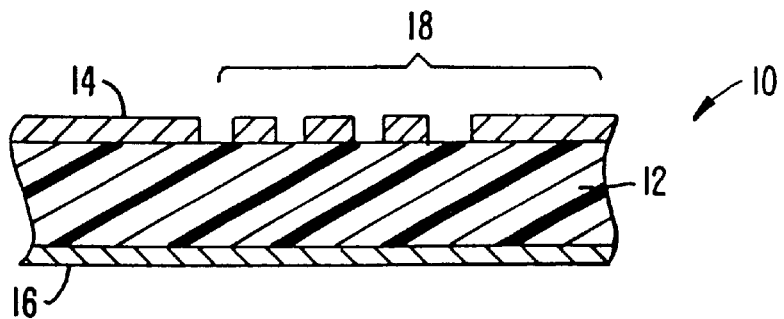
FIG. 1A is a simplified cross section of a laminated board as is used to form a multi-layer laminated wiring substrate.

FIG. 1A is a simplified cross-sectional view of a single laminate printed wiring board substrate 10 that can be used as a sub-laminate sheet in a multi-layer laminated substrate. The substrate is formed from a layer of insulating material 12 such as "NEMA FR5" epoxy resin with copper sheets 14 and 16 laminated to its upper and lower surfaces, respectively. "Upper and lower" are used herein simply as relative terms for ease of description, and do not limit the actual orientation of any layer or structure. The copper sheets are half-ounce copper foil, for example. A desired conductor pattern 18 is transferred to the copper using photolithography and a wet chemical etch to remove the unwanted copper, leaving the desired circuit pattern. Several of these sub-laminates with various circuit patterns can be laminated together to form a four layer printed wiring substrate as shown in FIG. 1B.

Figure 1B:
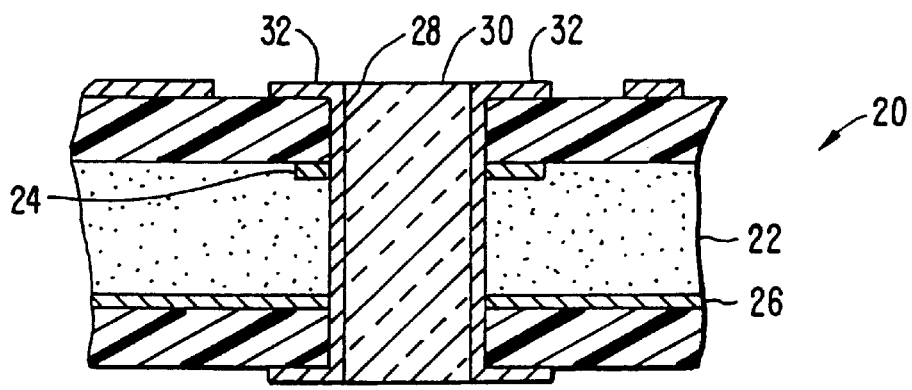
FIG. 1B is a simplified cross section of a multi-layer laminated wiring substrate.

FIG. 1B is a simplified cross-sectional view of a four layer-printed wiring board substrate 20 which can make use of the present invention. The substrate includes two sub-laminate structures similar to that shown in FIG. 1A. "Four-layer" refers to the four metal layers- two on each sub-laminate sheet. An additional insulative epoxy layer 22 separates and joins the sub-laminate sheets. Internal conductive layers 24, 26 are typically used for power and ground planes and to provide stiffness to the printed wiring board substrate, although signal lines may be incorporated into these layers. A plated through hole ("PTH") 28 forms an electrical connection between one conductive layer and another. These plated through holes are filled with a plug material 30, for example, a conductive epoxy. The plug material provides a planar surface with the collar or flange of the PTH to form a pad 32, however, the surface step topology of this laminated substrate is typically about 20–35 microns. Alternatively, the PTH can be capped (not shown), with or without filling.

Figure 1C:
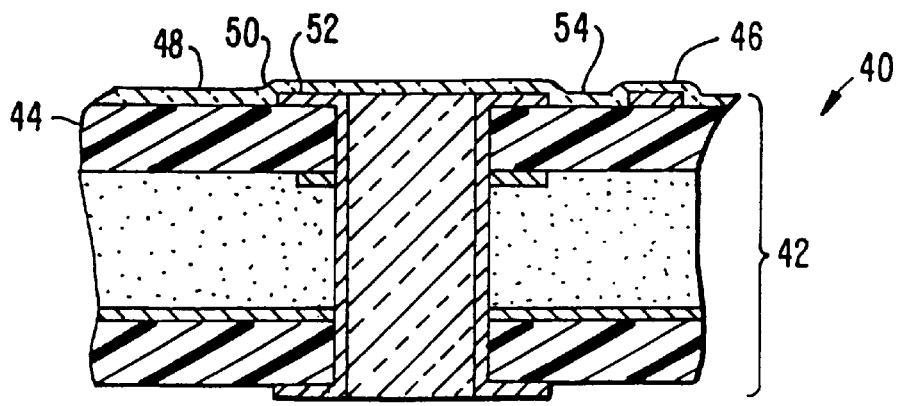
FIG. 1C is a simplified cross section of a multi-layer laminated wiring substrate with a dielectric build-up layer on a surface of the substrate.

FIG. 1C is a simplified cross section of a portion of a printed wiring substrate 40 with a laminated substrate base 42. The laminated substrate base includes a dielectric layer 44, as discussed above in relation to FIG. 1B. as well as a patterned metal layer 46. A conventional build-up layer 48 has been applied to the laminated substrate. This build-up layer has at least two attributes that affect its use in subsequently forming signal lines having a selected characteristic impedance. First, the thickness of the build-up layer varies, such as at the corners 50 of the metal features 52. Second, the layer is not planar, but has dips 54 between the metal features, having a typical surface step topology of between about 3–5 microns. Another aspect of the build-up layer is that it is often thick enough to cause some laminated substrates to warp unless a compensating build-up layer is also formed on the opposite surface of the substrate.

Figure 1D:
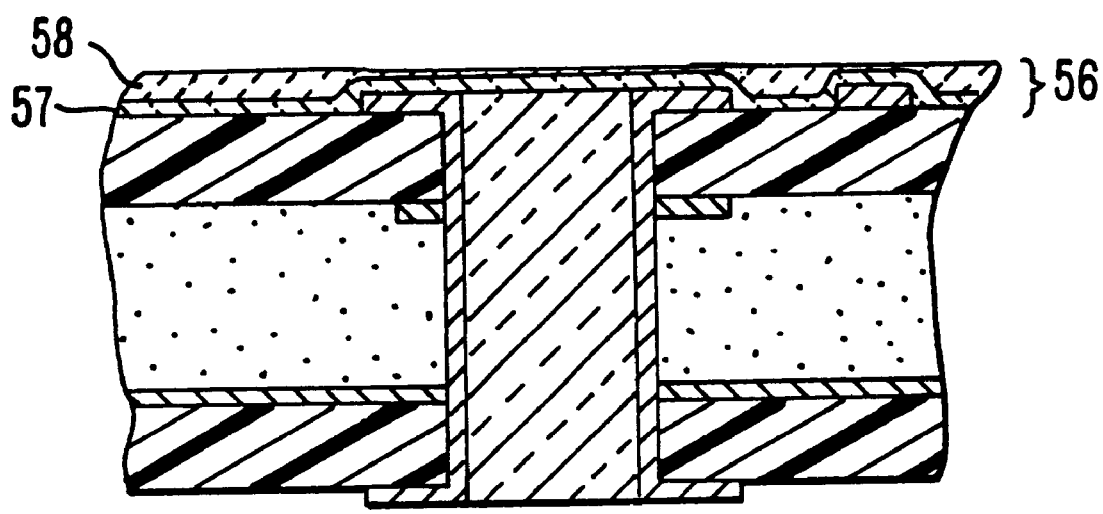
FIG. 1D is a simplified cross section of a multi-layer laminated wiring substrate with a planarized layer according to an embodiment of the present invention.

FIG. 1D is a simplified cross section of a portion of a printed wiring substrate with a planarized layer 56 according to an embodiment of the present invention. The planarizing layer 56 has been formed by applying a second layer 58 of dielectric material over a first layer 57 of dielectric material. The planarizing layer material could be applied as a liquid, by spinning, spraying, or curtain dipping, for example. In a preferred embodiment, both layers are the same material, resulting in consistent dielectric properties throughout the layer, as well as convenient photo-developing. It is believed that the resultant planarized surface is achieved through a combination of the surface tension and viscosity of the applied liquid dielectric layer precursor, in addition to the reduced step height and "softening" (rounding) of the step edges produced by the first dielectric layer.

Figure 2:
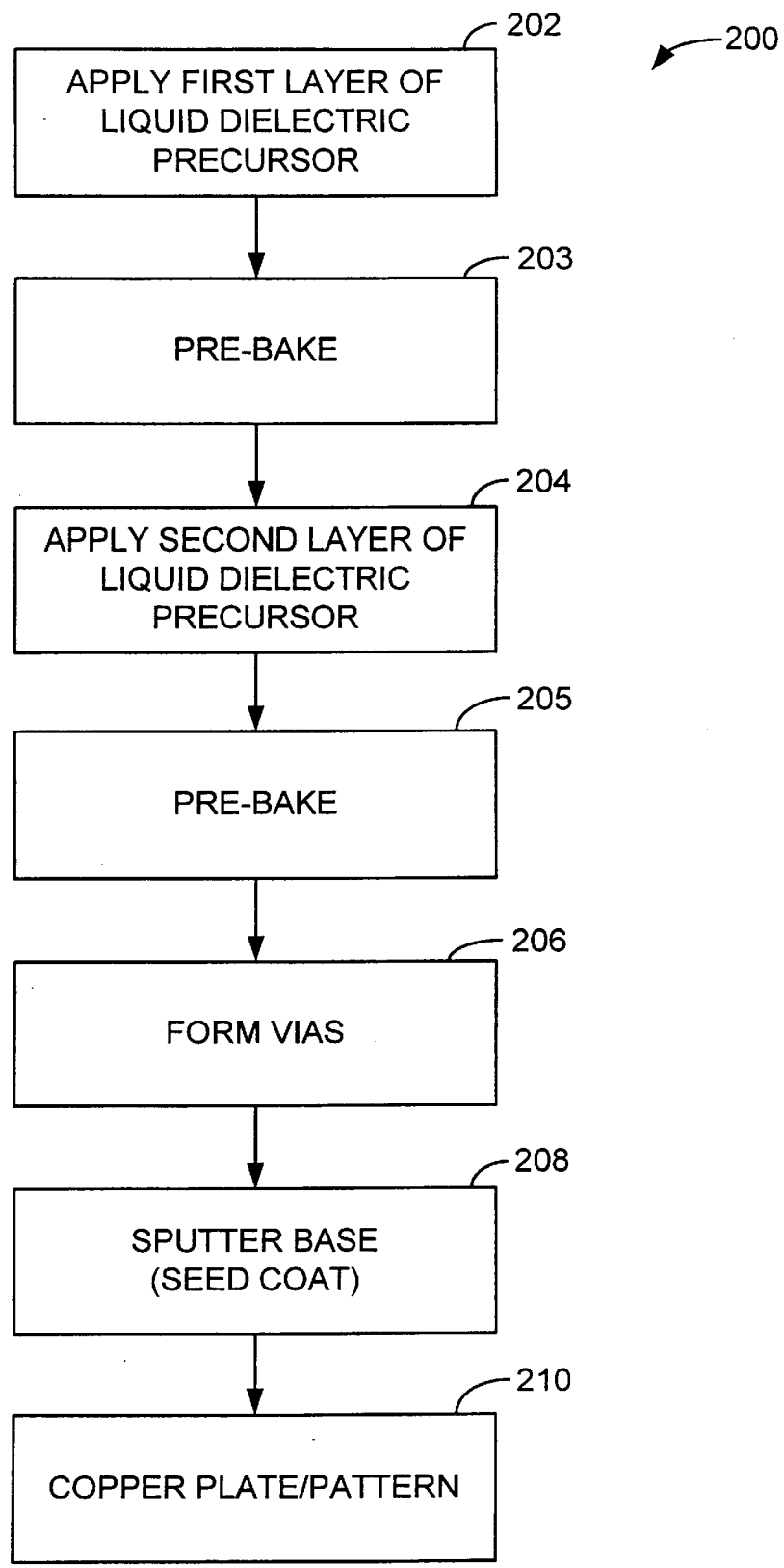
FIG. 2 is a simplified flow chart of a process for making a planarized layer on a laminated printed wiring substrate and subsequent patterned thin-film metal layer, according to another embodiment of the present invention.

FIG. 2 is a simplified flow chart of a process 200 of fabricating a high-density, improved impedance wiring substrate according to an embodiment of the present invention. A first layer of a liquid dielectric precursor material is applied to a laminated wiring substrate (step 202). In a preferred embodiment, the planarizing dielectric material is spun-on V-259PA™, available from NIPPON STEEL of Tokyo, Japan, or AVATREL™, available from the BF GOODRICH COMPANY, for example. In another embodiment, a planarizing dielectric layer may be applied on a build-up layer surface of a substrate supplied by the substrate vendor. In general, it is desirable that the planarized dielectric layer have a surface step topology of about 2 microns or less. After forming the planarized dielectric layer, vias are formed through the dielectric layer (step 206), by photo exposing, developing, and curing to access underlying metal features.

In a particular embodiment, an initial 35 micron step height of the surface metal layer was reduced to about 20 microns with a first application of a 10 micron thick spun-on layer of V-259PA™. The assembly was pre-baked at 90° C. for 30 minutes and a second coat of V-259PA™ was spun-on. The second coat was also applied to a thickness of about 10 microns, for a total dielectric layer thickness of about 25 microns, and pre-baked. The thicknesses of the dielectric layers are those thicknesses that would be expected to result if a single layer were applied. However, applying one layer over another, without intermediate developing or complete polymerization, results in some swelling of the first layer, and hence a total thickness slightly greater than might be expected from a simple sum of the thicknesses of the two layers. Vias were formed in this dielectric layer by photo exposing and developing, as is known in the art, followed by a curing bake at 160° C. for 1.5 hours.

A thin metal base was formed by sputtering a metal base or "seed" coat of chromium-copper about 2 microns thick (step 208) onto the planarized dielectric layer and then copper plating (step 210). Alternatively, the entire layer may be sputtered or alternative plating methods can be used. The metal layer can then be patterned using well known techniques such as a photo-lithography and etch process.

Figure 3A:
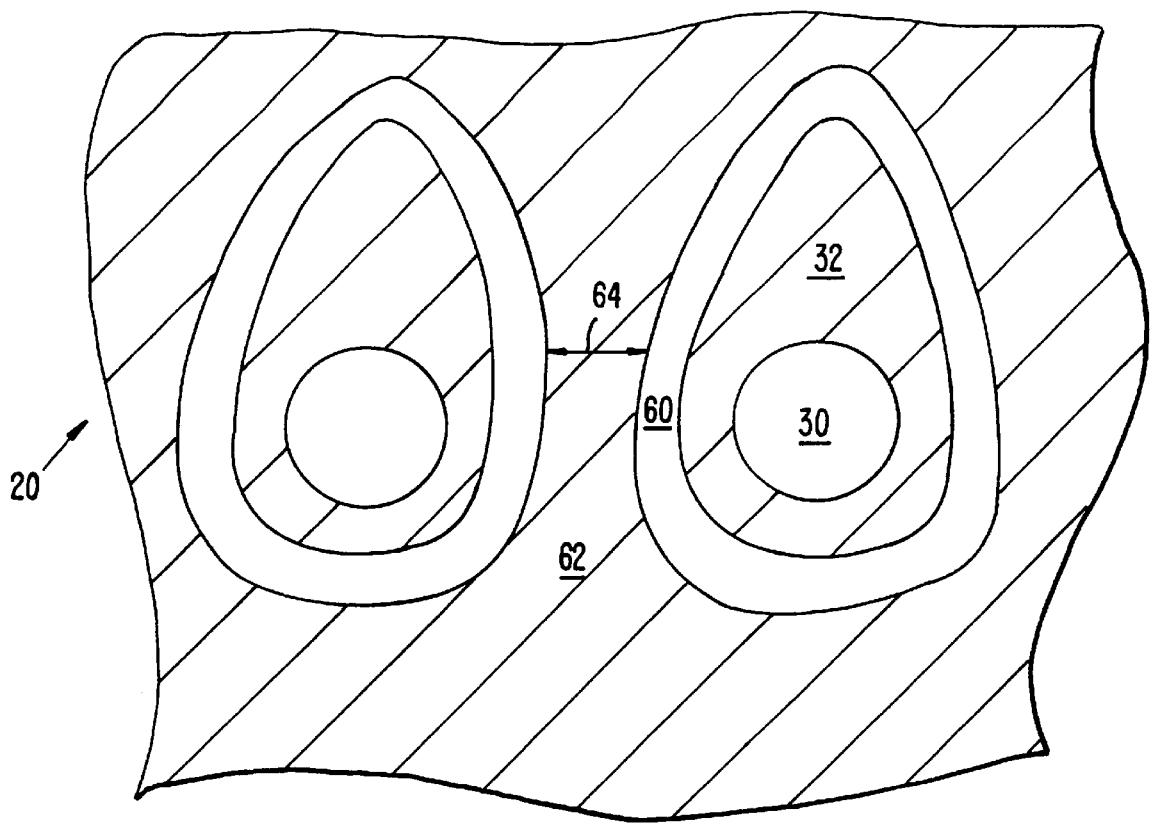
FIG. 3A is a simplified top view of a pad, insulating ring, and remaining area in a surface metal layer of a laminated wiring board.

FIG. 3A is a simplified representation of a top view of PTH pads 32 on the surface of a multi-layer laminated substrate 20. The pads, which serve as an electrical contact area for the PTHs (not shown in this view) that are filled with a plug material 30, have an electrically insulating circumferential ring or gap 60 between the pad 32 and the metal field 62 to electrically isolate the two structures. By way of example only, if the pitch of the PTHs is 1 mm (typically laid out in a grid pattern) and the diameter of a metal flange and its associated circumferential gap is 0.8 mm, then the distance, represented by the arrow 64, between two adjoining PTHs is only 0.2 mm. These dimensions are consistent with current laminated board technology. For ease of discussion, the combined area of the pad and its associated circumferential gap will be referred to as the "pad footprint".

Figure 3B:
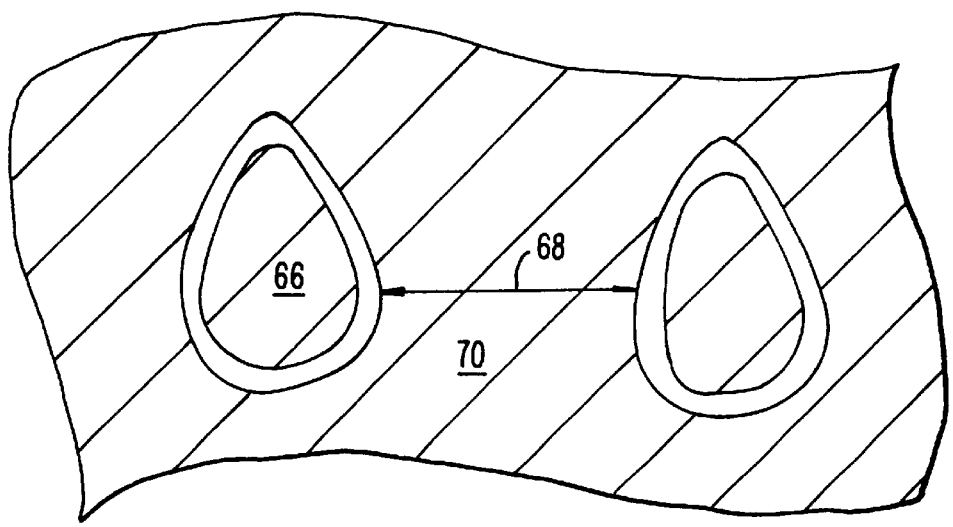
FIG. 3B is a simplified top view of a pad, insulating ring, and remaining area in a thin-film metal layer formed on a planarized layer.

FIG. 3B is a simplified representation of a top view of a pad 66 formed on a planarized layer using a thin-film process according to the present invention. For purposes of illustration, the PTH pitch is 1 mm and a PTH (not shown) underlies and is electrically connected to the pad; however, because of the improved process control provided by forming the pad on the planarized layer, the reduced footprint of the pads provides a separation, represented by the arrow 68, of approximately 0.75 mm. Thus, by stepping the contact pad from the laminate to the planarized layer, the metal plane 70 that remains is greatly increased.

Figure 4:
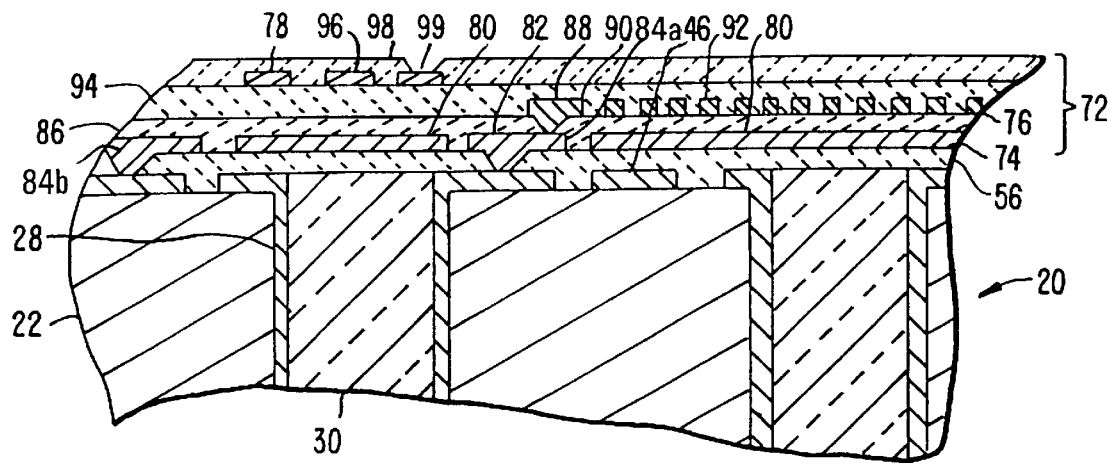
FIG. 4 is a simplified cross section of a wiring substrate having a multi-layer thin-film stack and a planarized layer formed on a laminated printed wiring substrate.

FIG. 4 is a simplified cross section of a planarized layer 56 on a laminated wiring substrate 20 with a thin film stack 72 having three thin-film metal layers 74, 76, 78 (also referred to as first, second and third-patterned thin-film layers, respectively), according to an embodiment of the present invention. "Thin-film" generally means that the metal layers are less than about 10 microns thick. Processes for forming such layers include sputtering and pattern plating. In pattern plating, a very thin "seed" layer is typically sputtered before a plating step provides the rest of the metal to the layer. Alternatively, the entire layer could be sputtered; however, pattern plating is preferred to retain the desired pattern geometry. The dielectric layers in the thin-film stack are similarly as thin, in general; however, in some applications the dielectric layer may be thicker than 10 microns. Additionally, in some structures, multiple thin dielectric layers may combine to form a portion of a dielectric layer that is thicker than 10 microns. The intervening dielectric layer(s) are typically formed by applying a viscous liquid polymer precursor that generally results in a dielectric material with a relative dielectric constant less than 5, and in some instance as low as about 2, or less. A planarized dielectric layer 56 has been formed on the laminated wiring substrate 20, and a first patterned thin-film metal layer 74 has been formed on the build-up layer, which is about 15–30 microns thick. In relative terms, the surface of the planarized layer is 90% fully planarized with a step topology of about 2 microns. The first thin-film metal layer is about 4–10 microns thick, and is copper plated over a chrome-copper seed layer. Portions of this first thin-film metal layer serve as a reference, or "ground", plane 80, as discussed in further detail below. It is understood that "ground" is a relative term, and that the actual reference potential may not be at earth ground potential. A conductive via 82 (i.e., a first via 82), such as described above in conjunction with FIG. 3B, makes electrical contact to the underlying PTH 28 (i.e., a first pad). The top of the conductive via is shown as flat, and the thicknesses of the layers are exaggerated, for purposes of illustration. It is understood that a small dimple or depression may occur over the via opening; however, because of the thinness of the layers in the thin-film stack, in addition to the use of viscous liquid polymer precursors for subsequent dielectric layers, acceptable planarity is maintained. Second pad 84 and third pad 84b associated with these vias have a substantially smaller footprint, typically teardrop shaped, with a width (essentially perpendicular to the signal line routing direction typically between about 50–68 microns, but often less than 40 microns, than the underlying PTH pads, due at least in part to the superior planarity of the surface in combination with the line resolution of the thin-film processes. For comparison, a similar pad formed on a conventional build-up layer over a laminated surface metal layer would have a width of typically between about 75–100 microns, but possibly as low as 45 microns, using similar process technology.

As illustrated in FIG. 4, reference (ground) plane 80, which is formed as a portion of first patterned thin-film metal layer 74, is disposed between second pad 84a and third pad 84b of first patterned thin film metal layer 74. Second pad 84a and third pad 84b are arranged with a pitch (i.e., with a predetermined distance separating their centerpoints) and reference plane 80 is disposed between the third pad and the second pad for a length greater than about 70% of the pitch.

A second dielectric layer 86 has been formed over the first thin-film metal layer 74. This second dielectric layer is spun-on V-259PA™, for example, and is about 10 microns thick, but could be other material and/or another thickness. A second thin-film metal layer 76 has been formed over the second dielectric layer 86 and patterned. The second thin-film metal layer is formed by pattern plating or sputtering, for example. A second conductive via 88 has been formed using a photo-exposure and development process. The pad 90(i.e., fourth pad 90) of the second conductive via is only about 38 microns across in one embodiment, but smaller dimensions are possible. As illustrated in FIG. 4, fourth pad 90 is electrically coupled to second pad 84b via second via 88.

In this embodiment, signal lines 92 patterned in the second thin-film metal layer operate in conjunction with the second dielectric layer 86, and a reference plane portion 80 of the first thin-film metal layer to form a signal transmission line of a desired characteristic impedance, $Z_0$. In a particular embodiment, the signal lines are about 16 microns wide and are separated from each other by a spacing of about 16 microns to result in a nominal line impedance of about 50 ohms. In another embodiment, the signal lines are wider to achieve lower impedance. Alternatively, the intervening dielectric layer can be made thinner to retain high-density routing of the signal lines. This desired impedance depends on, among other factors, the width of the signal lines, the distance of the signal line from the reference plane, and the dielectric constant of the dielectric material separating the signal line 92 from the reference plane 80. Therefore, the thickness of the dielectric material is chosen according, at least in part, to the dielectric constant of the material to achieve a selected coupling between the signal lines and the reference plane, in light of the desired characteristic impedance.

In one embodiment, it is desired that most of the signal lines have a characteristic impedance of about 50 ohms. In another embodiment it is desirable that most of the signal lines have a characteristic impedance of about 28 ohms. In general, a signal line with an impedance higher than 50 ohms is more susceptible to noise. A signal line with a very low impedance may take additional charge and/or time to reach a desired signal potential. It is desirable, but not essential, that the reference plane be situated between the signal lines and the laminated wiring substrate. It is also desirable that the signal lines do not pass over a pad.

First, the pad (which may not be at ground potential) and the gap around the pad disrupt the characteristic impedance of the line. Second, a pad may be "hot", having either a DC or AC voltage that affects signals carried on the signal line. Additionally, even if a pad is not hot, it may act as a noise source, coupling noise energy onto the signal line. It is understood that a signal line does not have to pass over the reference plane for its entire length to achieve the desired impedance, and that some portions, such as the ends, of the signal lines will not pass over the reference plane. However, if a signal line passes over the reference plane for a substantial portion of its length, the desired impedance can be obtained. Referring again to FIGS. 3A, 3B, and 4, the stepped pad structure in combination with the thin-film metal layer provides an improved reference plane structure that allows most of the signal lines to be routed substantially over the reference plane and thus to achieve the desired impedance.

A third dielectric layer 94 about 10 microns thick has been formed over the second metal layer 76. The third dielectric layer can be V-259PA™, for example, with a thickness of about 10 microns. This dielectric layer, and others, can also serve to passivate the underlying metal, and if used as the top layer in a stack, can also serve as a solder mask. If only the first thin film metal layer 74 is present, than the second (next) dielectric layer 86 could serve as a solder mask and passivating layer, etc. In other words, greater or fewer numbers of layers could be used, and this thin film stack is merely exemplary.

In this embodiment, an optional third thin-film metal layer 78 about 3.5 microns thick has been formed over the third dielectric layer 94. Additional vias between the metal layers are present, but have not been shown for purposes of illustration. Signal lines 96 (i.e., a plurality of second signal lines 96) have been patterned in the third thin-film metal layer. These second signal lines are further away from the reference plane 80 than the signal lines 92 in the second thin-film metal layer. In order to achieve the same desired characteristic impedance, the second signal lines in the third thin-film metal layer are wider than the signal lines in the second thin-film metal layer. However, it is not essential that all signal lines in the thin-film stack are designed to have the same characteristic impedance.

A passivation layer 98 about 10 microns thick has been formed over the third thin-film metal layer. Contact openings 99 in the top of the passivation layer provide the high-density connection pads for an integrated circuit device that can be electrically connected to the thin-film stack of the printed wiring substrate by, for example, wire bonding or flip chip techniques as understood by a person of ordinary skill in the art. Additional vias (not shown) connect various conductive features in different layers of the thin-film stack to the laminated substrate. Plated through holes 28, provide the low-density connection pads on the opposite side (not shown) of the laminated printed wiring substrate 20 that interface to the outside world. Optionally, a second build-up layer (not shown) can be applied to the opposite side of the laminated substrate 20 to balance the stress placed on the printed wiring substrate by the build-up layers on the surface with the thin-film stack. This balancing layer can also serve as a solder mask to connect the high density interconnect structure to the outside world, for example, to a mother board, cable, or connector. Table 1, below, shows the area of ground plane available for signal trace wiring, stated as a percentage, for different metal layers in a printed wiring substrate. A pad pitch of 1 mm is used as an example. The first column is the nominal pad footprint diameter (pad plus insulating gap). The second column is the distance the ground plane runs between pads, and the third column is the percentage of the ground plane potentially available for signal trace wiring where the entire length of the trace would be over the ground reference plane. It is understood that signal trace orientation, interconnect pad location, and chip components reduce the available ground plane area and that these numbers are given as comparative examples. Furthermore, if very few traces are involved, all of the traces could be over the reference plane. The effect that available ground plane and deposition/lithography technologies have on line impedance is further discussed below in conjunction with FIG. 5.

TABLE 1

| Technology | Pad Footprint | Ground Plane Run | % Groundplane Available |
| --- | --- | --- | --- |
| Laminated PWB | 0.8 mm | 0.2 mm | 20 |
| Build-Up Layer | 0.45 mm | 0.55 mm | 55 |
| Thin-film Layer | 0.16 mm | 0.84 mm | 84 |

The pad pitch is determined by the desired mounting pitch of the host board. For purposes of this example, the pitch will remain constant while the pad opening diameters can change as the pads are stepped up through the layers. For example, a typical ball grid array has a pad pitch of 1.0 mm. Since the pad opening diameter of the conventional (laminated) printed wiring board is about 0.8 mm, it can be seen that only about 0.2 mm of ground plane exists between pads. This allows only about five signal lines, each about 16 microns wide with 16 micron gaps separating the lines, to be routed between pads and over the ground plane.

As the data in Table 1 show, on a conventional build-up layer, the pad opening diameter can be reduced to 0.45 millimeters, providing 0.55 mm of ground plane between pads. This translates into a 55% reference plane area available for signal routing. The pad opening diameter can be reduced to about 0.16 mm using a dual layer thin film dielectric planarization method according to the present invention. This results in about 84% of the signal lines being able to be routed over the ground plane area of the first metal layer to achieve the desired characteristic impedance. Of course, the pad opening diameter could be made bigger, and in a particular embodiment the pad diameter is about 38 microns, resulting in about 62% of the ground plane area being available.

Alternatively, greater design latitude is provided when laying out the signal lines, if the lines are not so dense as to require the entire available ground plane area. Using current signal line routing techniques, a high-density printed wiring substrate incorporating the present invention can have over 90% of the signal lines within the design impedance tolerance limit, typically 10% of the target impedance. In a particular embodiment, 94% of the signal lines are 50±5 ohms. It is recognized that a pad footprint of 0.16 mm is given as an example when the pitch remains 1 mm. The pad size can be further reduced to accommodate a finer pitch, such as an integrated circuit chip with a solder-ball array, and the present invention can transition between one pitch and another.

Figure 5:
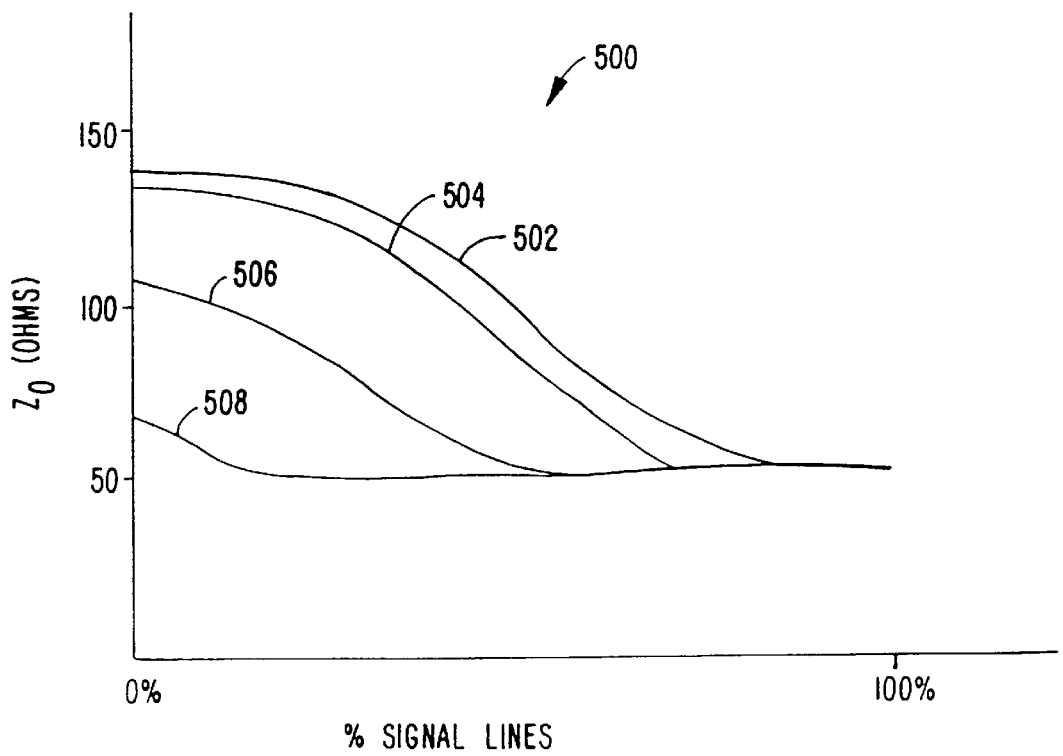
FIG. 5 is a simplified graph illustrating the improvement in line impedance gained by various embodiments of the present invention in relation to conventional printed wiring substrates.

FIG. 5 is a simplified graph 500 illustrating the portion of signal lines having a desired characteristic impedance for various layers in a printed wiring substrate. For purposes of illustration, a pad pitch of 1 mm will be used. As described above in conjunction with FIG. 3A, a laminated printed wiring substrate typically has a pad footprint of about 0.8 mm. For a typical, exemplary high-density wiring pattern, only about 15% of the signal lines will be able to be routed over a ground plane to achieve the desired design impedance of 50 ohms, as illustrated by the first curve 502. The availability to form a signal line of the desired impedance is affected by both the pad footprint and the process limitations, i.e. critical dimension, of the laminated PWB technology. A second curve 504 shows that about 20% of the signal lines will meet the desired impedance if the PTHs are capped or filled. If a conventional build-up layer is used under the thin film metallization, a little over 50% of the signal lines, exhibit the desired characteristic impedance, as shown by a third curve 506. If dual layer dielectric planarization method is used in conjunction with thin-film metal layers over 90% of the signal lines have the desired characteristic, as shown in a fourth curve 508, depending on the designed pad dimensions.

What the percentages shown in FIG. 5 express is that, using a conventional printed wiring board for example, signal traces will run over the ground plane for their entire length only about 15% of the time. The balance of the traces will run over the ground plane for only part of their length. Some traces will run over the ground reference plane for most of their length, some for a moderate segment of their length, and others for little of their length, yielding a very non-uniform impedance characteristic.

An additional advantage of using thin-film techniques on a planarized layer is that a transition can be made between the relatively coarse (i.e. 1 mm) pad pitch of the laminated printed wiring substrate to a much finer pitch of a solder bump array, which can be as close as 100 microns. It is understood that a minimum pad size may be required for a particular electrical connection technique. Another advantage of using a multi-layer dielectric planarization technique, versus a build-up layer, for example, is that the stresses created by the planarization layers is much less than a conventional build-up layer. Hence, it is not necessary to balance the stress by applying a similar layer or layers on the opposite side of the laminated wiring substrate, as is common with conventional build-up techniques.

From the above discussion it can be seen that uniformity of signal line impedance can vary as a result of the percent of reference plane available. As seen in FIG. 5, not only does the number of signal lines having the desired characteristic impedance vary according to the technology used, but the divergence, i.e. the difference between the target impedance and the highest impedance, varies with the technology used. Thus, the present invention provides for a greater number of signal lines within the design impedance tolerance, and signal lines falling outside of the design impedance tolerance are more likely to be closer to the design impedance than conventional signal lines. Stated differently, use of the present invention will allow maximum signal line routing freedom with a minimum of impedance variation among the total population of signal lines.

While the invention has been fully described above, those skilled in the art will recognize alternatives embodiments and equivalents. For example, while specific materials and dimensions have been described for a selected characteristic impedance, other materials and dimensions can achieve the same impedance, or another characteristic impedance. Similarly, the polymer-type liquid dielectric precursors are given as examples only, as are the methods of their application. Other liquid dielectric precursor materials exist or may be developed, and a positive-type material is specifically contemplated. Other metal systems and methods of layer formation might be used as well, such as physical vapor deposition, low temperature chemical vapor deposition, or other types of metals other than copper-based layers. These equivalents and alternative embodiments are intended to be within the scope of the invention. Accordingly, the scope of the invention should not be limited by the examples given above, but is to be interpreted according to the claims below.

What is claimed is:

1. A printed wiring substrate comprising:
    a laminated printed wiring substrate having a patterned metal layer on a surface of the laminated printed wiring substrate, the patterned metal layer including a first pad;
    a planarized dielectric layer disposed on the surface of the laminated printed wiring substrate and covering at least a portion of the first pad of the patterned metal layer, the planarized dielectric layer comprising a first dielectric layer portion proximate to the laminated printed wiring substrate, and a second dielectric layer portion disposed on the first dielectric layer portion;
    a first via extending from an upper surface of the second dielectic layer portion of the planarized dielectric layer to the first pad;
    a patterned thin-film metal layer formed on the planarized layer, a second pad of the patterned thin-film metal layer being electrically coupled to the first pad through the first via;
    a third pad of the patterned thin-film metal layer, the third pad and the second pad being arranged with a pitch; and
    a reference plane portion of the patterned thin-film metal layer, the reference plane portion disposed between the second pad and the third pad.

2. The printed wiring substrate of claim 1 wherein both the first dielectric layer portion and the second dielectric layer portion are comprised of the same dielectric material.

3. The printed wiring substrate of claim 2 wherein the dielectric material is a polymer material applied as a liquid and photo-developed.

4. The printed wiring substrate of claim 1 wherein the third pad and the second pad are arranged with a pitch; and
    wherein the reference plane portion is disposed between the third pad and the second pad for a length greater than about 70% of the pitch.

5. The printed wiring substrate of claim 4 further comprising:
    a thin dielectric layer disposed on the patterned thin-film metal layer, the thin dielectric layer having a second via extending from a surface of the thin dielectric layer to the second pad; and
    a second patterned thin-film metal layer disposed on the thin dielectric layer, a fourth pad of the second patterned thin-film metal layer being electrically coupled to the second pad through the second via.

6. The printed wiring substrate of claim 5 further comprising:
    a second thin dielectric layer disposed on the second patterned thin-film metal layer; and
    a third patterned thin-film metal layer.

7. The printed wiring substrate of claim 6 wherein the third patterned thin-film metal layer includes a plurality of second signal lines, a second signal line of the plurality of second signal lines overlying the reference plane portion and having a second width, the second width being greater than the signal line width of the signal line of the second patterned thin-film metal layer, the second width being chosen to provide the second signal line with the selected characteristic impedance.

8. The printed wiring substrate of claim 5 wherein the thin dielectric layer is a polymer material having a thickness less than or equal to about 10 microns.

9. The printed wiring substrate of claim 1 wherein the second patterned metal layer is a pattern-plated layer having a thickness of less than about 10 microns.

10. The printed wiring substrate of claim 9 wherein the thin-film metal layer is a sputtered metal layer.

11. The printed wiring substrate of claim 1 wherein the planarized dielectric layer is about 90% planarized with a step topology less than about 2 microns.

12. A printed wiring substrate comprising:
a laminated printed wiring substrate having a patterned metal layer on a surface of the laminated printed wiring substrate, the patterned metal layer including a first pad having a first minimum diameter;
a planarized layer disposed on the surface of the laminated printed wiring substrate and covering at least a portion of the first pad of the patterned metal layer, the planarized layer including a second layer portion disposed on a first layer portion and having a surface step topology of less than about 2 microns, a first via extending from the surface of the planarized layer to the first pad;
a first patterned thin-film metal layer having a first thickness of less than about 5 microns formed on the planarized layer, the first patterned thin-film metal layer including a reference plane portion and a second pad, the second pad of the first patterned thin-film metal layer being electrically coupled to the first pad through the first via;
a first dielectric layer having a first selected thickness equal to or less than about 10 microns disposed on the first patterned thin-film metal layer, the first dielectric layer having a second via extending from a surface of the first dielectric layer to the second pad; and
a second patterned thin film metal layer formed on the first dielectric layer, the second patterned metal having a plurality of signal lines disposed over the reference plane portion such that at least about 70% of the plurality of signal lines have a characteristic impedance within about 10% of a selected design impedance.

13. A printed wiring substrate comprising:
a laminated printed wiring substrate having a patterned metal layer on a surface of the laminated printed wiring substrate;
a planarized layer disposed on the surface of the laminated printed wiring substrate and covering at least a portion of the patterned metal layer, the planarized layer having a surface step topography of equal to or less than about 2 microns;
a first patterned thin-film metal layer disposed above the surface of the laminated printed wiring substrate;
a second patterned thin-film metal layer disposed above the surface of the laminated printed wiring substrate; and
a dielectric layer disposed between the first patterned thin-film layer and the second patterned thin-film layer, wherein one of the first patterned thin-film metal layer and the second patterned thin-film metal layer has a ground plane and a pad, the other of the first patterned thin film metal layer and the second patterned thin-film metal layer includes a plurality of signal lines, at least about 55% of the signal lines having a characteristic impedance within about 10% of a design impedance, the design impedance being about 28–50 ohms.

14. A printed wiring substrate comprising:
a laminated printed wiring substrate having a patterned metal layer on a surface of the laminated printed wiring substrate, the patterned metal layer including a first pad;
a planarized layer disposed on the surface of the laminated printed wiring substrate and covering at least a portion of the first pad of the patterned metal layer, a first via extending from a surface of the planarized layer to the first pad;
a patterned thin-film metal layer formed on the planarized layer, a second pad of the patterned thin-film metal layer being electrically coupled to the first pad through the first via;
a third pad of the patterned thin-film metal layer, the third pad and the second pad being arranged with a pitch;
a reference plane portion of the patterned thin-film metal layer, the reference plane portion disposed between the second pad and the third pad;
a thin dielectric layer disposed on the patterned thin-film metal layer, the thin dielectric layer having a second via extending from a surface of the thin dielectric layer to the second pad; and
a second patterned thin-film metal layer disposed on the thin dielectric layer, a fourth pad of the second patterned thin-film metal layer being electrically coupled to the second pad through the second via;
wherein the third pad and the second pad are ranged with a pitch; and
wherein the reference plane portion is disposed between the third pad and the second pad for a length greater than about 70% of the pitch; and
wherein the second patterned thin-film metal layer includes a plurality of signal lines, a signal line of the plurality of signal lines overlying the reference plane portion and having a signal line width, wherein a thickness of the thin dielectric layer is chosen according to the signal line width and a dielectric constant of a dielectric material comprising the thin dielectric layer to achieve a selected characteristic impedance of the signal line, and wherein at least about 70% of the plurality of signal lines have an impedance within about 10% of the selected characteristic impedance.

15. The printed wiring substrate of claim 14 wherein at least about 90% of the plurality of signal lines have an impedance within about 10% of the selected characteristic impedance.

16. A printed wiring substrate comprising:
a laminated printed wiring substrate having a patterned metal layer on a surface of the laminated printed wiring substrate, the patterned metal layer including a first pad;
a planarized dielectric layer disposed on the surface of the laminated printed wiring substrate and covering at least a portion of the first pad of the patterned metal layer, a first via extending from a surface of the planarized dielectric layer to the first pad;
a patterned thin-film metal layer formed on the planarized dielectric layer, a second pad of the patterned thin-film metal layer being electrically coupled to the first pad through the first via;
a third pad of the patterned thin-film metal layer, the third pad and the second pad being arranged with a pitch; and
a reference plane portion of the patterned thin-film metal layer, the reference plane portion disposed between the second pad and the third pad;
wherein the third pad and the second pad are arranged with a pitch; and
wherein the reference plane portion is disposed between the third pad and the second pad for a length greater than about 70% of the pitch.

17. The printed wiring substrate of claim 16 further comprising:
a thin dielectric layer disposed on the patterned thin-film metal layer, the thin dielectric layer having a second via extending from a surface of the thin dielectric layer to the second pad; and a second patterned thin-film metal layer disposed on the thin dielectric layer, a fourth pad of the second patterned thin-film metal layer being electrically coupled to the second pad through the second via.

18. The printed wiring substrate of claim 17 further comprising:

a second thin dielectric layer disposed on the second patterned thin-film metal layer; and a third patterned thin-film metal layer.

19. The printed wiring substrate of claim 18 wherein the third patterned thin-film metal layer includes a plurality of second signal lines, a second signal line of the plurality of second signal lines overlying the reference plane portion and having a second width, the second width being greater than the signal line width of the signal line of the second patterned thin-film metal layer, the second width being chosen to provide the second signal line with the selected characteristic impedance.

20. The printed wiring substrate of claim 17 wherein the thin dielectric layer is a polymer material having a thickness less than or equal to about 10 microns.

21. A printed wiring substrate comprising:

a laminated printed wiring substrate having a patterned metal layer on a surface of the laminated printed wiring substrate, the patterned metal layer including a first pad;

a planarized dielectric layer disposed on the surface of the laminated printed wiring substrate and covering at least a portion of the first pad of the patterned metal layer, a first via extending from a surface of the planarized dielectric layer to the first pad;

a patterned thin-film metal layer formed on the planarized dielectric layer, a second pad of the patterned thin-film metal layer being electrically coupled to the first pad through the first via;

a third pad of the patterned thin-film metal layer, the third pad and the second pad being arranged with a pitch; and a reference plane portion of the patterned thin-film metal layer, the reference plane portion disposed between the second pad and the third pad;

wherein the planarized dielectric layer is about 90% planarized with a step topology less than about 2 microns.

* * * * *